United States Patent
Franzen et al.

(10) Patent No.: US 9,864,355 B2
(45) Date of Patent: Jan. 9, 2018

(54) TEST DEVICE FOR TESTING A VIRTUAL ELECTRONIC CONTROL UNIT

(71) Applicant: dSPACE digital signal processing and control engineering GmbH, Paderborn (DE)

(72) Inventors: Ortwin Ludger Franzen, Bad Lippspringe (DE); Karsten Kruegel, Paderborn (DE)

(73) Assignee: dSPACE digital signal processing and control engineering GmbH, Paderborn (DE)

( * ) Notice: Subject to any disclaimer, the term of this patent is extended or adjusted under 35 U.S.C. 154(b) by 747 days.

(21) Appl. No.: 14/270,849

(22) Filed: May 6, 2014

(65) Prior Publication Data

US 2014/0330401 A1    Nov. 6, 2014

(30) Foreign Application Priority Data

May 6, 2013   (EP) .................................. 13166604
Feb. 4, 2014  (EP) .................................. 14153755

(51) Int. Cl.
*G05B 17/02*     (2006.01)
*G06F 17/50*     (2006.01)
(Continued)

(52) U.S. Cl.
CPC ............. *G05B 17/02* (2013.01); *G05B 15/02* (2013.01); *G05B 23/02* (2013.01); *G06F 17/5009* (2013.01)

(58) Field of Classification Search
None
See application file for complete search history.

(56) References Cited

U.S. PATENT DOCUMENTS

2008/0147209 A1   6/2008  Landgraf
2009/0240477 A1   9/2009  Higuchi et al.
(Continued)

FOREIGN PATENT DOCUMENTS

CN    102023922 B    9/2012
DE    38 39 211 A1   5/1990
(Continued)

OTHER PUBLICATIONS

Japanese Office Action for Japanese Application No. 2014-095806 dated Sep. 28, 2015 with English translation.
(Continued)

*Primary Examiner* — Qing Wu
(74) *Attorney, Agent, or Firm* — Muncy, Geissler, Olds & Lowe, P.C.

(57) ABSTRACT

A test device for testing at least a portion of a virtual control unit with a simulation environment in a simulator, having the virtual control unit and the simulation environment. The virtual control unit has at least one software component with an external data interface. The simulation environment has a data interface for indirect data exchange with the virtual electronic control unit. A reduced dependency between the virtual control unit and the simulation environment with the result that electrical fault simulation with virtual electronic control units is possible in a simpler way, is achieved in that a virtual control unit pin module and a virtual manipulation unit are additionally provided between the virtual control unit and the simulation environment, the two units transmit a virtual physical control unit signal through a virtual control unit pin of the virtual electronic control unit pin module. The virtual manipulation unit outputs a manipulated virtual physical control unit signal.

13 Claims, 7 Drawing Sheets

(51) Int. Cl.
G05B 23/02 (2006.01)
G05B 15/02 (2006.01)

(56) References Cited

U.S. PATENT DOCUMENTS

| | | | |
|---|---|---|---|
| 2010/0100365 | A1 | 4/2010 | Moriyama |
| 2012/0143518 | A1 | 6/2012 | Kim et al. |
| 2012/0232869 | A1 | 9/2012 | Maturana et al. |

FOREIGN PATENT DOCUMENTS

| | | |
|---|---|---|
| EP | 1 291 742 A2 | 3/2003 |
| EP | 1 933 214 A2 | 6/2008 |
| EP | 2 672 660 A1 | 6/2008 |
| JP | 2000-040014 A | 2/2000 |
| JP | 2008-269022 A | 11/2008 |
| JP | 2011-123676 A | 6/2011 |
| WO | WO 2015/107611 A1 | 7/2015 |

OTHER PUBLICATIONS

European Search Report for European Application No. 14153755.5 dated Aug. 13, 2014 with English translation.
Thanagasundram et al., "Reconfigurable Hardware-in-the-Loop Simulator," XP055133639, at http://www.researchgate.net/profile/SugunaThanagasundram/publication/Reconfigurable hardware in the loop Simulator/file/9fcfa506cf189813d6d.pdf, pp. 273-277 (Nov. 30, 2010).
AUTOSAR; Feature Specification of the BSW Architecture and the RTE; V1.1.0; Dec. 20, 2011.
AUTOSAR; Requirements on Diagnostic; V2.4.0; Dec. 9, 2011.
AUTOSAR; Requirements on Diagnostic Log and Trace; V1.0.0; Nov. 30, 2009.
AUTOSAR; Requirements on I/O Hardware Abstraction; V1.1.0; Dec. 7, 2009.
AUTOSAR; Specification of CAN Interface; V5.0.0; Dec. 1, 2011.
AUTOSAR; Specification of Diagnostic Communication Manager, V4.2.0; Dec. 1, 2011.
AUTOSAR; Specification of Diagnostic Event Manager; V4.2.0; Dec. 9, 2011.
AUTOSAR; Specification of Diagnostic Log and Trace; V1.2.0; Dec. 9, 2011.
Virtual ECUs as a Basis for an earlier Validation Strategy; Dr. Karsten Krügel, Dr. Klaus Lamberg dSPACE GmbH; IBS-Workshop Automotive Software Engineering; Dresden, Feb. 1, 2011.
Real-Time Implementation Guide; for ConfigurationDesk 4.1; Release 7.2—Nov. 2011; dSPACE GmbH.
AUTOSAR; Specification of ECU Resource Template; Version 2.2.0; Nov. 8, 2011.
AUTOSAR; Layered Software Architecture; Version 3.2.0; Version Oct. 6, 2011.
AUTOSAR; Specification for the ECU Resource Template; Version 1.0.5; Mar. 23, 2011.
V-ECU Implementation Inter-face Design Documentation; CDD[2]; dSPACE GmbH; Ulrich Kiffmeier; Jul. 4, 2012.
dSPACE Offline Simulator; dSPACE Catalogue 2013.
Chinese Office Action for Chinese Application No. 201410087645.3 dated Dec. 20, 2016—English translation.
Chinese Office Action for Chinese Application No. 201410180526.2 dated Dec. 29, 2016—English translation.
Chinese Office Action for Chinese Application No. 201410087645.3 dated Jul. 14, 2017 with English translation.
Chinese Office Action for Chinese Application No. 201410180526.2 dated Jul. 19, 2017 with English translation.
Xiao Hu, "Research on Embedded Software Testing of EPS Through ECU in the Loop Simulations," Masters Thesis, with English Abstract (Oct. 15, 2012) (Complete).
Liu et al., "Design of Engine Test System Based on Virtual Instruments," CNKI, with English Abstract (Dec. 31, 2012).
Xiao Hu, "Research on Embedded Software Testing of EPS Through ECU in the Loop Simulations," Masters Thesis, with English Abstract (Oct. 15, 2012).
Sujun Yang, "Research on Virtual Test System of Ship's Naviagtion Performace," Doctoral Dissertation, pp. 1-150 (Jan. 15, 2012).

TEST DEVICE FOR TESTING A VIRTUAL ELECTRONIC CONTROL UNIT

This nonprovisional application claims priority under 35 U.S.C. §119(a) to European Patent Application No. EP13166604.2, which was filed on May 6, 2013, and to European Patent Application No. EP14153755.5, which was filed on Feb. 4, 2014, and which are both herein incorporated by reference.

BACKGROUND OF THE INVENTION

Field of the Invention

The present invention relates to a test device for testing at least a portion of a virtual electronic control unit with a simulation environment in a simulator, having the virtual electronic control unit and the simulation environment, wherein the virtual electronic control unit comprises at least one software component with at least one external data interface, wherein the simulation environment comprises at least one data interface for at least indirect data exchange with the virtual electronic control unit.

Description of the Background Art

Today non-virtual, which is to say "real," control units are usually considered to be small computers with an I/O interface (I/O=input/output) that often are equipped with a real-time-capable operating system that allows even complex tasks, mostly feedback control tasks, to be implemented on the control unit. Control unit development is a core part of the technical development of large-scale equipment facilities such as are known from industrial practice. The use of control units in the automotive industry and in the aerospace industry is cited by way of example.

Testing of the mass produced control unit employed in the end product is the final point of multiple preceding development steps of a closed-loop or open-loop control to be implemented on the control unit, wherein these development steps usually are described with the so-called V-model or else V-cycle. Controller development, which is essential for functionality of many technical systems, starts off with the mathematical modeling of the control algorithm on a computer with a mathematical and graphical modeling environment, wherein the controller should be considered a part of the control unit. In addition, the environment of the control unit is also modeled mathematically, since the interaction of the controller on the control unit with the process to be controlled is of interest. In these functional mathematical considerations, simulation in real time generally is not necessary (offline simulation).

In the next step, using rapid control prototyping, the control algorithm developed previously is transferred to a powerful hardware unit, usually a hardware unit that is real-time-capable, which is connected to the actual physical process by suitable I/O interfaces, which is to say to a motor vehicle engine, for instance. Generally speaking, this real-time-capable hardware unit has nothing to do with the mass produced control unit that will later be employed; at issue here is proof of the basic functionality in practice of the previously developed control.

In another step, as part of automatic production code generation the control that is likely to actually be employed later in the mass produced control unit is implemented on the target processor. Accordingly, in this step, the target hardware approximates the mass produced control unit, but is not identical to the mass produced control unit. In another step, the mass produced control unit—which normally does not exist until a later development stage—is tested in the framework of a Hardware-in-the-Loop test (HIL). The mass produced control unit physically present in this step is connected by means of its physical control unit interface to a powerful simulator here. The simulator simulates the required variables of the mass produced control unit to be tested, and exchanges input and output variables with the mass produced control unit. The pins of the physical control unit interface of the mass produced control unit are connected to the simulator by a cable harness. In this way, it is possible to simulate all required variables of a motor vehicle engine—if applicable the entire motor vehicle with engine, drive train, chassis, and plant model—in the simulation environment, and to test the behavior of the mass produced control unit in interaction with the simulation environment in a risk-free manner.

The mass produced control unit tested within the framework of the HIL simulation is ultimately tested in the "real" target system, which is to say, for example, installed in a motor vehicle and tested in the real physical environment that was merely imitated in the simulation environment.

The above-outlined development process in controller development has stood the test of time extremely well. However, the development process involves the circumstance that the mass produced control unit is not incorporated in the process until the very end of development, and thus also is not tested until the late development stages. Before the mass produced control unit is actually available, functionalities can only be tested at an abstract functional level with the indicated development process, which is to say practically only at the level of application software. A significant portion of the software components later employed on the mass produced control unit are not included in testing in early development stages. One of these software components is the runtime environment, for example, which mediates between the application software and the software layers close to the hardware. Examples of software layers close to the hardware include the operating system and platform-independent system software (system services, communication services, I/O hardware abstraction layer, etc.), and lastly, platform-dependent parts of the operating system and system software.

In addition to the above-described portions of a mass produced control unit that can only be subjected to a test quite late in the development process, there are also categories of tests that typically cannot be performed until the real control unit is present; this includes electrical fault simulation for real control units. For example, within the scope of this fault simulation, it is possible using suitable hardware connected to the control unit under test to apply a specific electrical potential, e.g., ground or the supply voltage, to control unit pins, to break connections between control unit pins and their external circuitry ("broken wire") or apply a resistance to the connection, to connect control unit pins to one another (short circuit between control unit pins), and to interchange wiring to different control unit pins ("crossed wire"), etc. (dSPACE catalog 2013, page 268, pages 280 ff. and pages 459 ff.). Of course, such fault cases can be combined, so that the control unit under test can ultimately also be observed in situations where multiple faults are present in the external electrical connection. To simplify the connection of faults, so-called "fail rails" can be used in the simulator or outside the simulator, which is to say electrical lines that carry a specific electrical fault signal and to which the control unit pins that are to be subjected to the corresponding fault can then be connected. The electrical fault simulation described heretofore is only possible when the control unit under test is available in the form of hardware, and thus the real control unit pins can also be physically connected. If only a virtual electronic control unit is available, then the only possibility that remains is to instrument the existing control unit code to simulate electrical faults in order to implement fault injection from that point (EP 2 672 660 A1), this method is resource-intensive and it may be necessary to adapt the instrumentation of the software to varying external data interfaces of the virtual electronic control unit. On the whole, it would be desirable to be able to perform a pin-based electrical fault simulation before the real mass produced control unit is available. Furthermore, it would be desirable to be able to reuse the same configurations, simulation models, and tests both when testing a virtual electronic control unit and when testing a mass produced control unit.

In order to include the aforementioned extensive software components of the mass produced control unit (runtime environment, system services, communication services, I/O hardware abstraction layer, etc.), in the development process early on, the aforementioned software components are—at least partly—reproduced as part of a so-called virtual electronic control unit and are simulated in a simulator (dSPACE Catalog 2013: "SystemDesk V-ECU Generation Module" and "VEOS"). The simulator can be one or more specialized computers, for example in the form of an HIL test stand, but a commercial PC can also be used as the simulator. In the simulator, the virtual electronic control unit interacts in all cases with the simulation environment that is likewise present in the simulator. The interaction takes place through the exchange of data through the at least one external data interface of a software component of the virtual electronic control unit and a data interface of the simulation environment. Which software components of the virtual electronic control unit provide an external data interface depends on which of the aforementioned software layers are represented in the virtual electronic control unit. If only the abstract application software is represented in the virtual electronic control unit, then the software components of the application software provide the external data interfaces to the simulation environment. In contrast, if the runtime environment is also a component of the virtual electronic control unit, then the external data interfaces are provided by their software components. If still lower software layers are represented, for example the operating system or system software components, then these software components provide the external data interface to the simulation environment.

It is evident that in each case the simulation environment must adapt to the external data interface of the software components of the virtual electronic control unit as a function of the software components reproduced in the virtual electronic control unit. Each change to the virtual electronic control unit that affects a software component with an external data interface also inevitably necessitates a change to the simulation environment and the data interface of the simulation environment, which is labor-intensive and introduces a source of errors in the development process. Another disadvantage is that the simulation environment adapted to a specific virtual electronic control unit as part of the HIL simulation—which is to say when the control unit is no longer present only in virtual form but is actually physically present—oftentimes cannot be used directly, since there is no provision of pin-related variables of the physical control unit at the data interface of the simulation environment that is necessary for such a use. This circumstance also essentially prevents a practical realization of the electrical fault simulation addressed above in connection with virtual electronic control units.

SUMMARY OF THE INVENTION

It is therefore an object of the present invention to provide a device for testing at least a portion of a virtual electronic control unit with a simulation environment in a simulator in which the dependencies between the virtual electronic control unit and the simulation environment are reduced so that, in particular, electrical fault simulation with virtual electronic control units is also possible in a simpler way.

The object derived above is attained in the above-described test device firstly and essentially by the means that the test device is augmented by a virtual electronic control unit pin module that has at least one virtual electronic control unit interface and is connected by means of the virtual electronic control unit interface at least to the external data interface of the software component of the virtual electronic control unit. In addition, the virtual electronic control unit pin module has at least one simulation environment interface, wherein the virtual electronic control unit pin module is connected by the simulation environment interface at least indirectly to the data interface of the simulation environment. In addition, provision is made for the virtual electronic control unit pin module to have at least one virtual electronic control unit pin that corresponds to a pin of the physical interface of a real control unit to be simulated, wherein a virtual physical control unit signal can be transmitted through the virtual electronic control unit pin, which signal describes, in the form of data, the physical control unit signals at the corresponding pin of the physical interface. Due to the provision of a virtual electronic control unit pin, a virtual representation is created of the corresponding real control unit pin of the physical interface of the control unit to be simulated. This is advantageous in connection with the measure according to the invention that provides for a virtual manipulation unit to have at least a first interface and a second interface, wherein the virtual manipulation unit is connected at least to the virtual electronic control unit pin of the control unit pin module by the first interface and is connected to the data interface of the simulation environment by the second interface, wherein the virtual manipulation unit outputs a manipulated virtual physical control unit signal through the first interface and/or the second interface. The two essential points of the test device according to the invention thus reside in the virtual electronic control unit pin module, which provides at least one virtual electronic control unit pin that corresponds to a pin of the physical interface of a real control unit to be simulated, and in the provision of the virtual manipulation unit, which can be connected to the corresponding virtual electronic control unit pins of the virtual electronic control unit pin module in a manner corresponding fully to the connection of hardware fault circuits to physical control unit pins of actual control units under test.

The virtual electronic control unit pin module provided in accordance with an embodiment of the invention mediates between the virtual electronic control unit and the simulation environment, which makes it possible to leave the simulation environment and its data interface unchanged even when the virtual electronic control unit is changed. Moreover, the additional provision of a virtual electronic control unit pin brings with it the possibility of defining the representation of the interface that the real control unit absolutely must also have, namely the physical interface of the real control unit. This establishes, on the simulator, a pin-related definition and handling of the interface between the virtual electronic control unit and the simulation environment.

The information exchanged through a virtual electronic control unit pin of the virtual electronic control unit pin module is a "virtual physical control unit signal" in that what is involved here is not the real physical control unit signals of the actual control unit, which is to say voltages, currents, connected resistances, but instead these physical quantities are calculated and the values are exchanged as corresponding data. In other words, a virtual physical control unit signal describes the physical control unit signals at the corresponding pin of the physical interface in the form of data. If only the more abstract software layers are represented in the virtual electronic control unit, for instance the application software or the runtime environment, then the external data interface of the virtual electronic control unit can only be functional in the abstract, but cannot provide a reproduction of the actual control unit in terms of signals. For example, if a pressure value or a temperature value (e.g., 950 bar, 275° C.) is supplied by a component of the application software, but not a corresponding electrically encoded variable that is exchanged in the case of the real control unit through pins of the physical interface, for example in the form of a voltage (e.g., 0 to 10 V), in the form of a current (e.g., 2 to 20 mA interface), or in the form of a modulated signal, the virtual electronic control unit pin module can now close this gap by the means that it transmits precisely such a virtual physical control unit signal, which is to say the value of the corresponding real physical control signal, to at least one virtual electronic control unit pin. Of course, the opposite direction of signal flow from the foregoing example is also possible, for instance in that a virtual physical control unit signal is retrieved from the virtual electronic control unit pin and transmitted in the direction of the virtual electronic control unit.

According to an embodiment of the invention, provision is made for the virtual manipulation unit to output a manipulated virtual physical control unit signal through one of its interfaces, for which reason the virtual manipulation unit as a general rule also has the capability to manipulate a virtual physical control unit signal, typically within the scope of reproducing an electrical fault case. In one exemplary embodiment of the test device, for example, provision is made for the manipulation unit to independently provide a manipulated virtual physical control unit signal, for example because the user has stored corresponding configuration data in the manipulation unit. Such a configuration could include a specific connection of the first interface and/or the second interface of the virtual manipulation unit is connected to electrical ground potential in a fixed manner, for example. In this case, no further information is needed to ascertain the manipulated virtual physical control unit signal, in particular no information from the simulation environment. An electrical fault simulation can include the predefined, and thus also manipulated, virtual physical control unit signal is transmitted through the first interface of the manipulation unit to the virtual electronic control unit pin module.

The manipulation unit can also be connected through its interfaces to more than one virtual electronic control unit pin of the virtual electronic control unit pin module. Of course, it is then not necessary for a manipulated virtual physical control unit signal to be output or transmitted through each of these connections, which is to say that it is not necessary for every channel to actually be manipulated by the virtual manipulation unit; virtual physical control unit signals can also be transmitted without being manipulated, for example.

The great advantage of the test device according to the invention resides in that complete continuity with regard to configuration, simulation, and testing is achieved between the fault simulation with real control units and the fault simulation with virtual electronic control units. Because of the pin-oriented design of the interfaces, the simulation environment can be used without further adaptation—at least insofar as it communicates through virtual electronic control unit pins of the virtual electronic control unit pin module—with the mass produced control unit implemented as hardware. With regard to the possible exemplary embodiments and designs of the virtual electronic control unit pin module, numerous variants are described in the application EP 13/166604 that establishes priority. For example, provision is made that the simulation environment interface of the virtual electronic control unit pin module has at least one virtual electronic control unit pin so that virtual physical control unit signals can also be transmitted through the data interface of the simulation environment. Furthermore, in a further development of the test device according to the invention, provision is made that the simulation environment interface of the virtual electronic control unit pin module is composed entirely of virtual electronic control unit pins so that exclusively virtual physical control unit signals are transmitted through the data interface of the simulation environment. In another variant, provision is made that the simulation environment interface of the virtual electronic control unit pin module has no virtual electronic control unit pins so that the virtual electronic control unit pin module establishes a direct connection between the virtual electronic control unit and the simulation environment, and the virtual electronic control unit pin module has the at least one virtual electronic control unit pin outside the simulation environment interface. These variants and their mixed forms are described in detail in the application documents that establish priority; in this regard, reference is made to the detailed discussions there.

According to an embodiment of the test device according to the invention, provision is made with regard to the virtual manipulation unit for the manipulation unit to calculate a manipulated virtual physical control unit signal based on information from the simulation environment and to transmit this signal to the virtual electronic control unit pin module through the first interface. Of course, mixed forms between these variants of the calculation of manipulated virtual physical control unit signals are also possible, which is to say that a manipulated virtual physical control unit signal can also be defined in the manipulation unit—hence no information from the simulation environment is required for calculating this manipulated virtual physical control unit signal—and a different manipulated virtual physical control unit signal can be calculated in the manipulation unit using information from the simulation environment or from the virtual electronic control unit.

In an embodiment of the test device, provision is made for the manipulation unit to receive a virtual physical control unit signal from the virtual electronic control unit pin module and to calculate a manipulated virtual physical control unit signal from the received virtual physical control unit signal, in particular transmitting the manipulated virtual physical control unit signal to the simulation environment through the second interface. Thus, in this case no fixed electrical fault is present; instead, an input variable is manipulated according to a specific functionality and is passed on in manipulated form. For example, it is possible to pass on a distorted voltage value based on a simulated voltage divider—possibly containing nonlinear elements.

According to an embodiment of the test device, provision is made to interpose the virtual manipulation unit between the virtual electronic control unit pin module and the simulation environment so that an indirect connection exists with the external data interface of the software component of the virtual electronic control unit and/or so that a connection is established with the parts of the data interface of the simulation environment that correspond to the external data interface of the software component of the virtual electronic control unit. In this exemplary embodiment, all signals pass through the virtual manipulation unit, which is to say not only the signals that are communicated through virtual electronic control unit pins of the virtual electronic control unit pin module. The virtual manipulation unit thus has access to not only the pin-oriented signals, but rather also to functional signals that are exchanged between the external data interface of the software components of the virtual electronic control unit and the simulation environment. This variant allows a more efficient simulation in certain cases, in particular a more efficient fault simulation within the virtual manipulation unit.

In particular, there are now a multiplicity of possibilities for implementing and further developing the test device according to the invention and the virtual electronic control unit pin module according to the invention. To this end, reference is made to the claims dependent on claim 1 and to the following description of preferred exemplary embodiments of the invention in conjunction with the drawings. In the drawings, Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
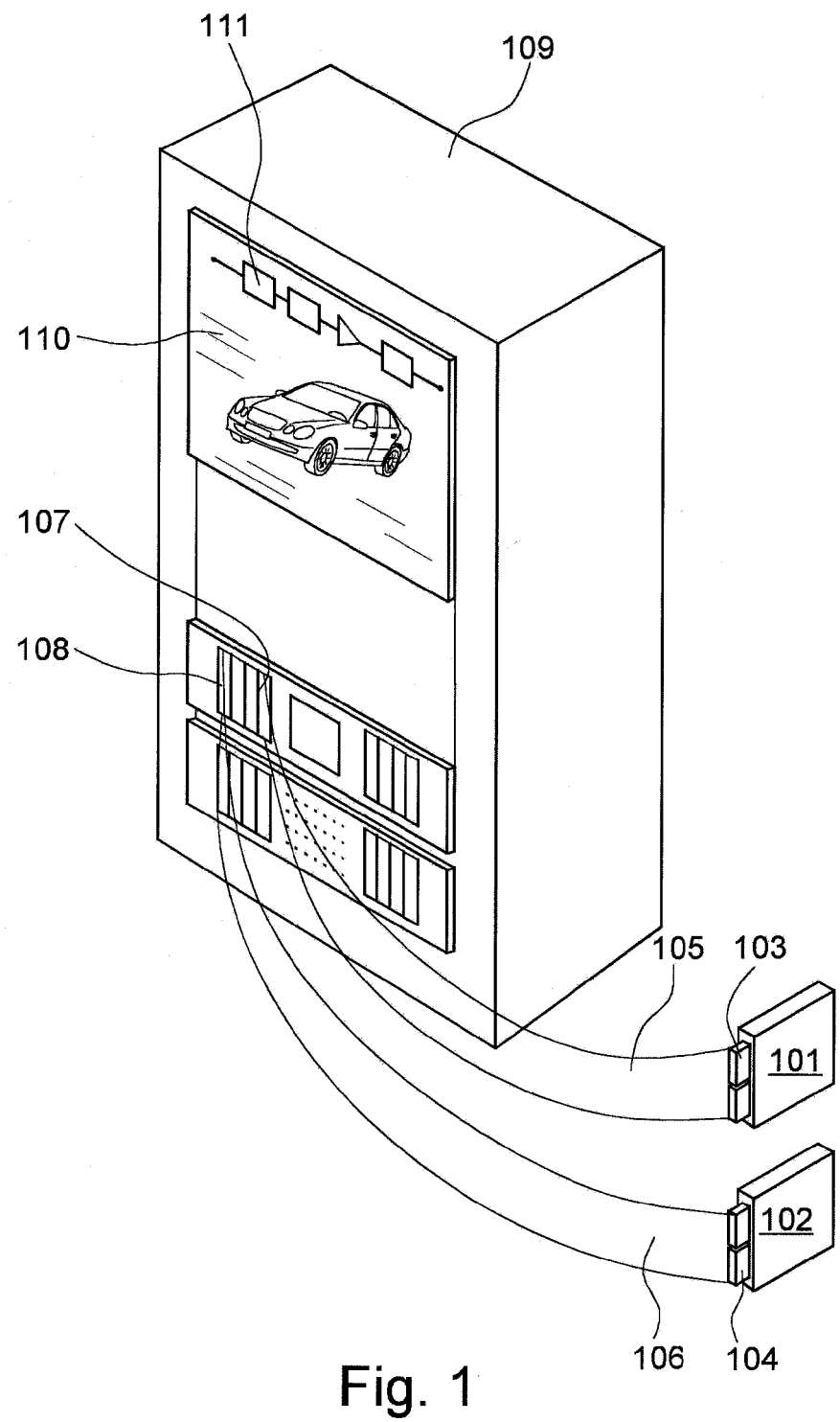
FIG. 1 shows a test setup known from the prior art for testing a real control unit with a simulator.

For the purpose of explaining the test device according to the invention, firstly, FIG. 1 shows a test setup known from the prior art using the principle of the hardware-in-the-loop test. No virtual electronic control units are present in the test setup shown, the real control units 101, 102 are the subjects of the tests. The real control units 101, 102 are connected through their physical interfaces 103, 104 and by cable harnesses 105, 106 to suitable I/O interfaces 107, 108 of a simulator 109. The simulator 109 itself also has, in addition to the I/O interfaces 107, 108, a simulation environment 110 that has as its subject a mathematical environment model that simulates the environment of the control unit, e.g., a motor vehicle model. The environment model is indicated by the block diagram 111. The test setup shown in FIG. 1 does not come into being until the mass produced control units 101, 102 are on hand at the end of the development process. Until this situation arises, it is not possible to test the software components of the real control units 101, 102 in interaction with the simulator. In the present case, the I/O interfaces 107, 108 also allow the simulation of electrical faults, which is to say that they have an electronic unit referred to in practice as a "failure insertion unit" for fault injection.

Figure 2:
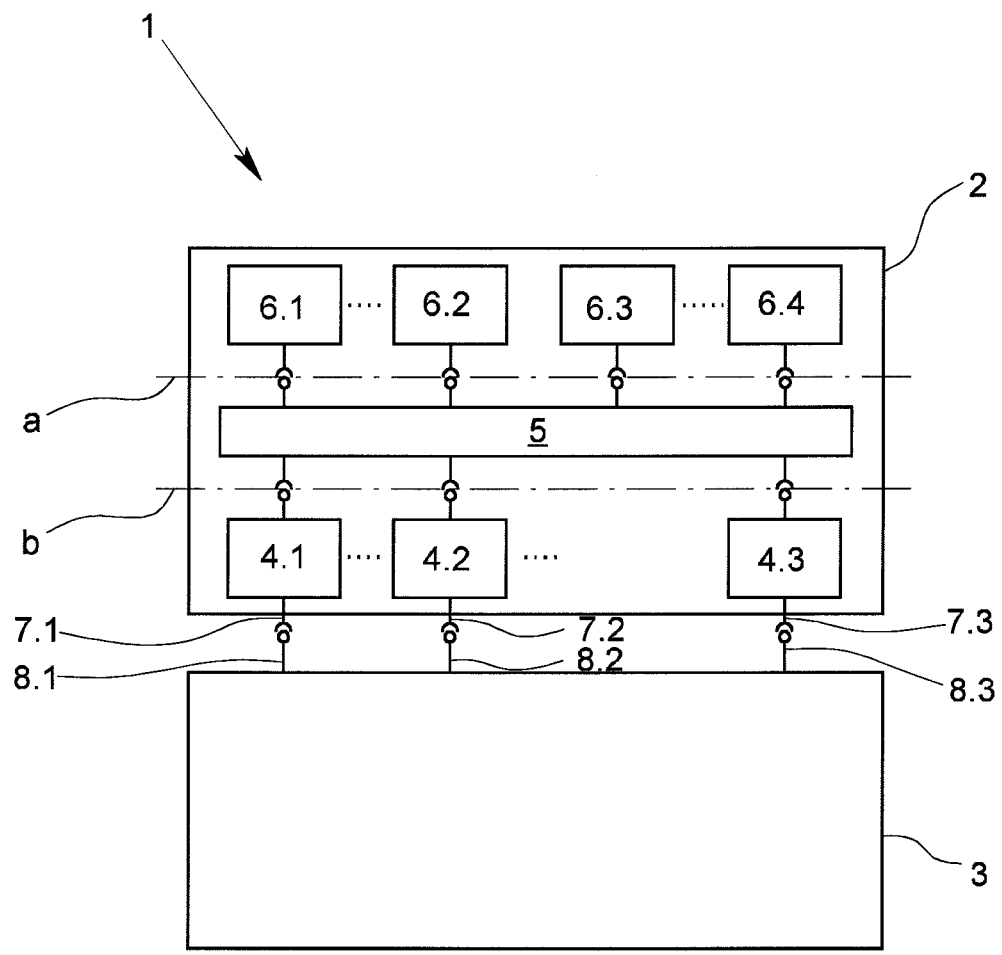
FIG. 2 shows a test device known from the prior art for testing a virtual electronic control unit with a simulation environment.

In order to allow the components of the software that will later be operated on the real control units 101, 102 [to be tested] in earlier steps of controller development, the test devices 1 shown schematically in FIG. 2 and known from the prior art have been introduced; these devices permit testing of a virtual electronic control unit 2 with a simulation environment 3. Test devices 1 of this nature are operated on a simulator that is not explicitly shown in FIGS. 2 through 7.

The virtual electronic control unit 2 comprises multiple software components 4, 5, 6 that belong to different abstract software layers. The different software layers are indicated in FIG. 2 by horizontal lines a, b. In the exemplary embodiment shown, the software components 6.1, 6.2, 6.3, and 6.4 are components of the application layer, in which software is implemented in a completely machine-independent manner, which is to say independently of the target platform. All software layers below this are closer to the hardware. The software component 5 comprises the runtime environment in the exemplary embodiment shown, and the software components 4.1, 4.2, and 4.3 comprise platform-independent as well as platform-dependent system software, for example in the form of the operating system and in the form of various communication services. The software components 4, 5, 6 are software components that are also intended to be employed later on the real control unit; however, within the framework of a virtual electronic control unit 2, the software components are operated on a simulator that is completely different in terms of equipment from the later real control unit.

The software components 4 stand in connection with the simulation environment 3. To this end, the software components 4 have external data interfaces 7.1, 7.2, and 7.3. Accordingly, the simulation environment has external data interfaces 8.1, 8.2, and 8.3. The virtual electronic control unit 2 shown in FIG. 2 is modeled to very closely approximate the hardware. This is not always the case in practice; in a different modeling of the virtual electronic control unit 2 only the software components 6.1 to 6.4 at the application layer might be present, for example, so that such a virtual electronic control unit would not have the software components 4 and 5. In this case, the interfaces of the software components 6 would be the external data interfaces because they would have to stand in connection with the simulation environment 3 in order to be able to ensure data exchange. It is evident from this example that a change to the virtual electronic control unit 2 in the prior art would necessitate a comprehensive adaptation of the simulation environment 3, which entails corresponding disadvantages: software maintenance, error-prone changes, etc. In the prior art, it is known to carry out (electrical) fault simulations in conjunction with virtual electronic control units 2 by the means that the software components 4, 5, 6 are altered in an appropriate way, which is to say are instrumented with corresponding fault code. The disadvantage associated therewith is obvious, since it is no longer the software components 4, 5, 6 that are also used later in the mass produced control unit that are tested, but instead the altered, which is to say instrumented, software components.

Figure 3:
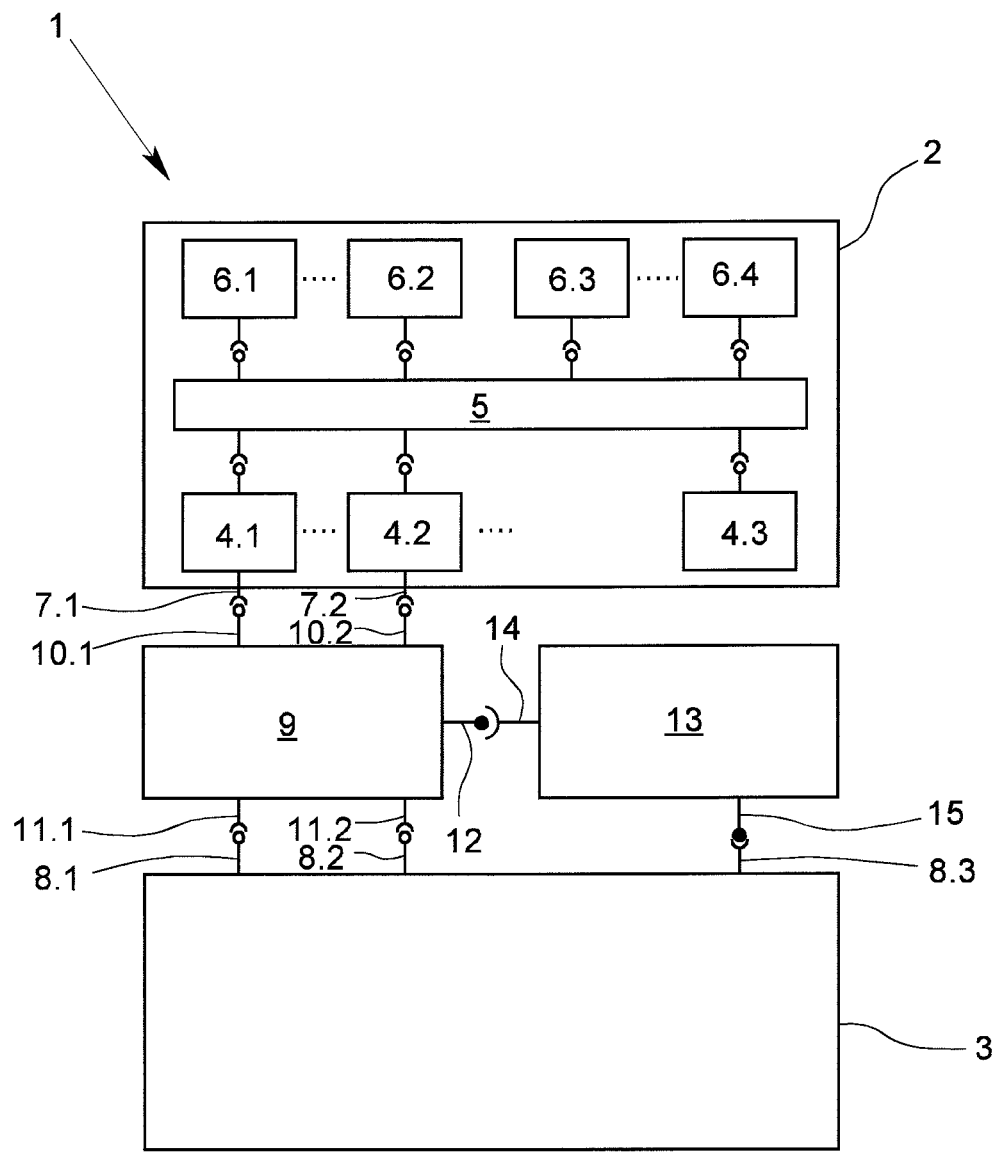
FIG. 3 shows a first exemplary embodiment for a test device according to the invention for testing a virtual electronic control unit with a virtual electronic control unit pin module and a virtual manipulation unit.

FIG. 3 now shows a test device 1 according to the invention with a virtual electronic control unit 2 and with a simulation environment 3, wherein a virtual electronic control unit pin module 9 mediating between the virtual electronic control unit 2 and the simulation environment 3 is now provided as well. The virtual electronic control unit pin module 9 has virtual electronic control unit interfaces 10.1, 10.2, by means of which the virtual electronic control unit pin module 9 is connected to the external data interfaces 7.1, 7.2, of the software components 4.1, 4.2 of the virtual electronic control unit 2. The virtual electronic control unit pin module 9 also has simulation environment interfaces 11.1, 11.2, and is connected to the data interfaces 8.1, 8.2 of the simulation environment 3 by the simulation environment interfaces 11.1, 11.2. Since all of these are components realized on a computer, the interfaces should not be understood as physical, but rather as functional, in the sense that data can be exchanged and made available—in whatever way—over the interfaces created.

The virtual electronic control unit pin module 9 also has a virtual electronic control unit pin 12 that corresponds to a pin of the physical interface of a real control unit to be simulated. A virtual physical control unit signal can be transmitted through the virtual electronic control unit pin 12. Thus, the virtual electronic control unit pin 12 emulates a pin of a physical interface of a real control unit. Accordingly, the variables that correspond to physical control unit signals of this pin are transmitted in the form of data here. The virtual electronic control unit pin 12 thus allows a view of the virtual electronic control unit 2 that is defined by the physical signal forms of the real physical interfaces of the real control unit that is to be simulated. For example, if a temperature at the application level of the virtual electronic control unit 2 is handled in the form of the specification T=2° C., then this same information is output through a virtual electronic control unit pin 12 as a signal U=2.35 V, for instance. In any case, the virtual electronic control unit pin module 9 makes it possible to obtain a signal view of the virtual electronic control unit 2, wherein this signal view can be used in different ways.

The test device 1 additionally has a virtual manipulation unit 13 with a first interface 14 and a second interface 15, wherein the virtual manipulation unit 13 is connected to the virtual electronic control unit pin 12 of the control unit pin module 9 by means of the first interface 14. The virtual manipulation unit 13 is connected to the data interface 8.3 of the simulation environment 3 by the second interface 15. The virtual manipulation unit 13 is designed such that it can exchange, in particular output, a manipulated virtual physical control unit signal through the first interface 14 and/or the second interface 15; accordingly, the data interface 8.3 of the simulation environment 3 is pin-oriented and not (only) functional in design. In other words, the virtual manipulation unit 13 serves to introduce fault injection into the signal path. It is an advantage of the method described that the configuration of the electrical fault simulation in the virtual manipulation unit 13 can be used in the various stations of control unit testing regardless of whether the virtual electronic control unit 2 or a real control unit is being tested.

The virtual manipulation unit can also be connected to the external data interface 7 of the virtual electronic control unit 2, for example in order to use functional information for fault simulation.

Figure 4:
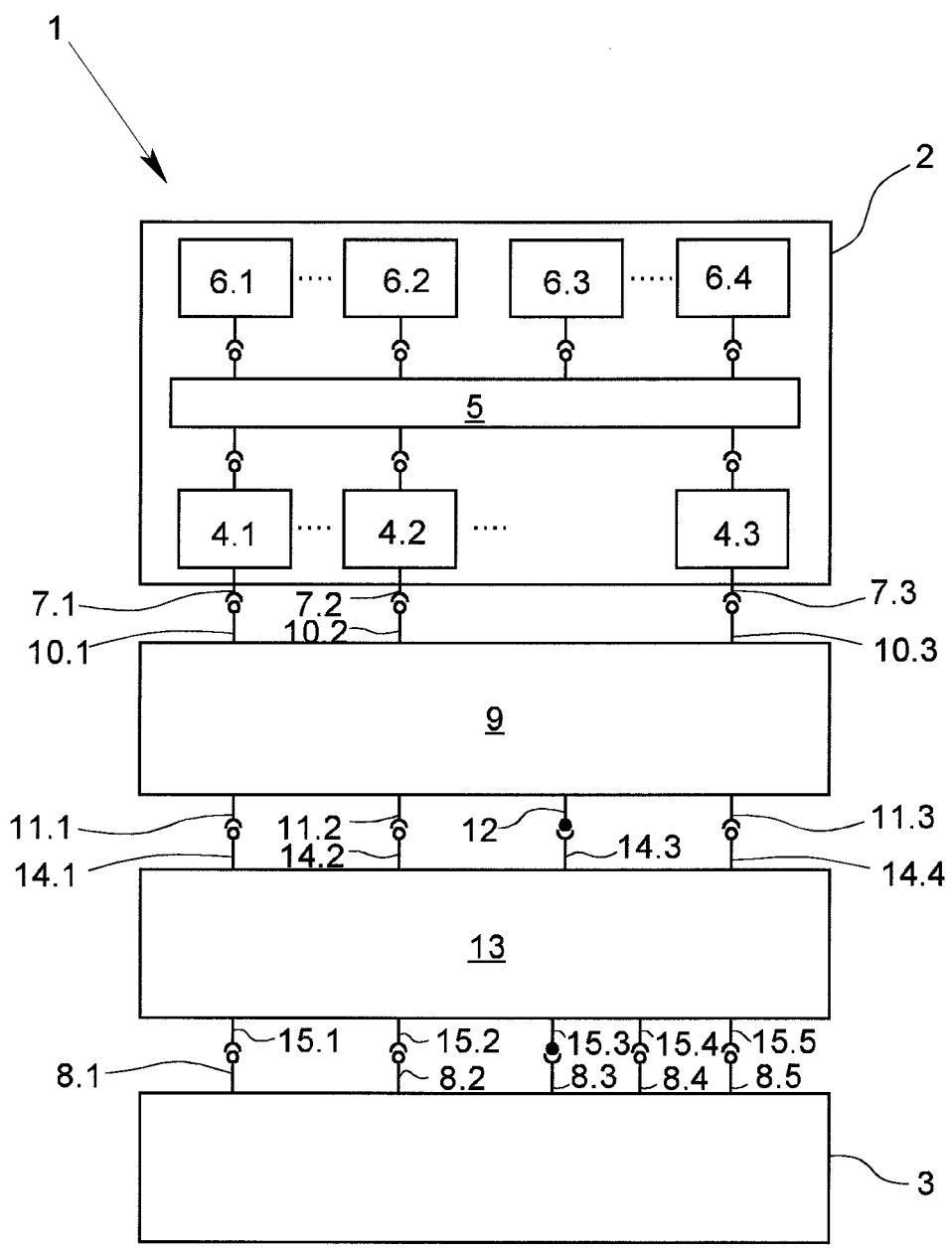
FIG. 4 shows another exemplary embodiment for a test device according to the invention for testing a virtual electronic control unit with a virtual electronic control unit pin module and a virtual manipulation unit.

FIG. 4 shows a test device 1 in which the virtual electronic control unit 2, the virtual electronic control unit pin module 9, the virtual manipulation unit 13, and the simulation environment 3 are connected to one another in a modified manner. In the exemplary embodiment, the virtual manipulation unit 13 is interposed between the virtual electronic control unit pin module 9 and the simulation environment 3 so that an indirect connection exists with the external data interface 7.1, 7.2, 7.3 of the software components 4.1, 4.2, 4.3 of the virtual electronic control unit 2. The virtual electronic control unit pin module 9 is also connected—indirectly via the virtual manipulation unit 13—to the data interface 8 of the simulation environment 3. The advantage of this variant should be considered that the virtual manipulation unit 13 not only receives virtual physical control unit signals from the virtual manipulation unit 13, but instead also obtains non-pin-related—which is to say purely functional—signals from the software components, which can be used for an electrical fault simulation in the virtual manipulation unit 13, for example. The virtual manipulation unit 13 in the exemplary embodiment from FIG. 4 is capable of calculating a manipulated virtual physical control unit signal on the basis of information from the external data interface 7 of the software components 4.1, 4.2, 4.3 of the virtual electronic control unit 2, just as the virtual manipulation unit 13 is capable of calculating a manipulated virtual physical control unit signal on the basis of information from the parts of the data interface 8 of the simulation environment 3 that correspond to the external data interface 7 of the software components 4.1, 4.2, 4.3 of the virtual electronic control unit 2.

The virtual manipulation units 13 shown in FIGS. 3 through 6 are designed such that they calculate a manipulated virtual physical control unit signal to reproduce an electrical fault at a manipulated virtual electronic control unit pin 12. In particular, provision is made for the virtual manipulation units 13 to output, at a manipulated virtual electronic control unit pin 12, a voltage value that corresponds to a short circuit to ground, to a supply voltage, or to another external electric potential. In order to simulate a short circuit between two virtual electronic control unit pins, provision is made for the virtual manipulation units 13 to output the same voltage value on both affected virtual electronic control unit pins as the manipulated virtual electronic control unit signal. In addition, provision is made for the virtual manipulation units 13 to interchange values intended for different virtual electronic control unit pins ("crossed wire") and to output them as manipulated virtual physical control unit signals. In another fault variant that is implemented, provision is made for the virtual manipulation units 13 to simulate an open virtual electronic control unit pin by specifying an electrical resistance value at this virtual electronic control unit pin.

Figure 5:
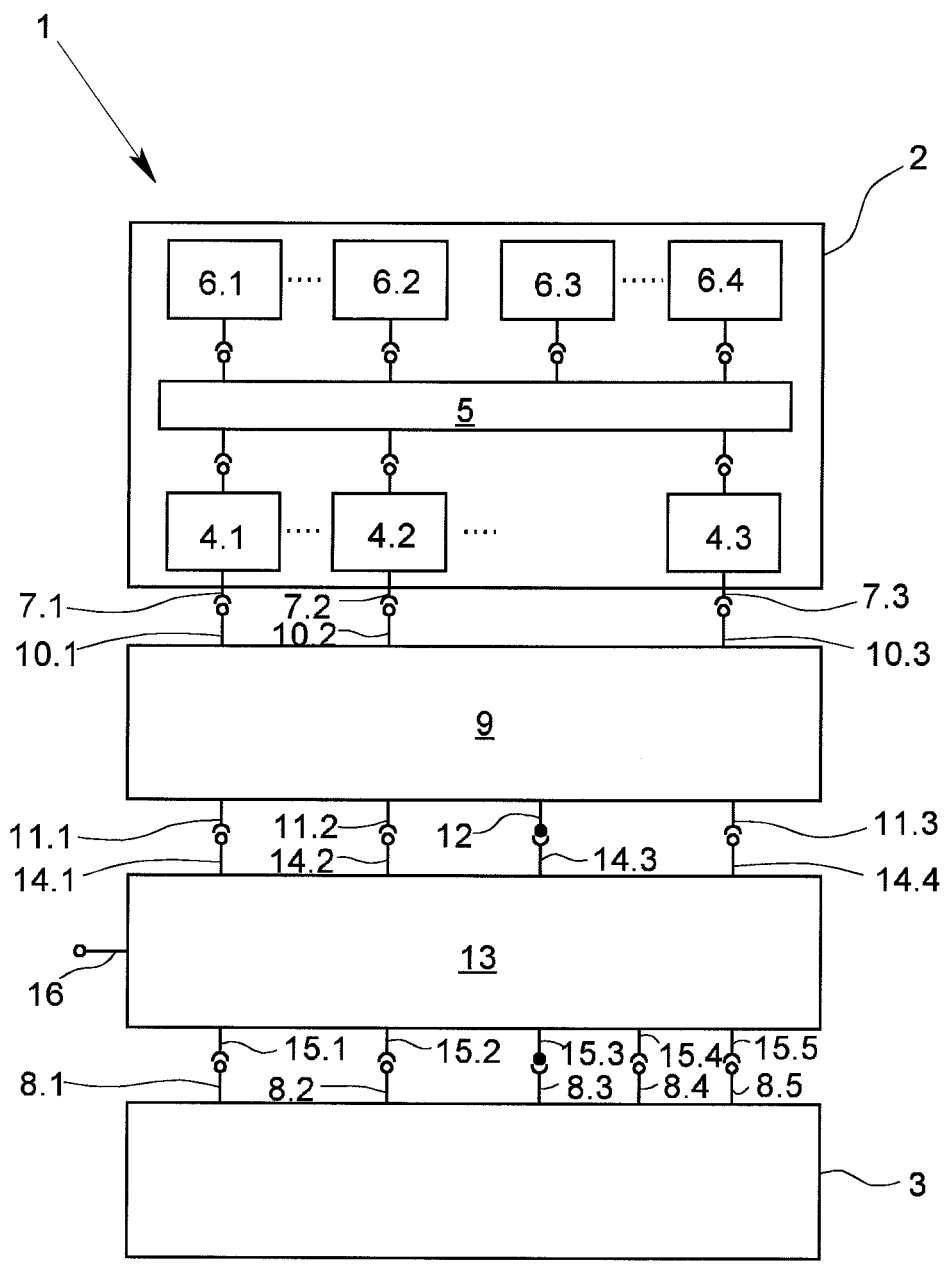
FIG. 5 shows another exemplary embodiment for a test device according to the invention based on the exemplary embodiment from FIG. 4.

The exemplary embodiment shown in FIG. 5 differs from the exemplary embodiment in FIG. 4 in that the virtual manipulation unit 13 has an additional interface 16 by which means electrical fault signals can be externally specified to the virtual manipulation unit 13. These fault signals may be in the specification of fixed virtual electric potentials, although variable virtual electrical fault signals can also be transmitted into the virtual manipulation unit 13.

Figure 6:
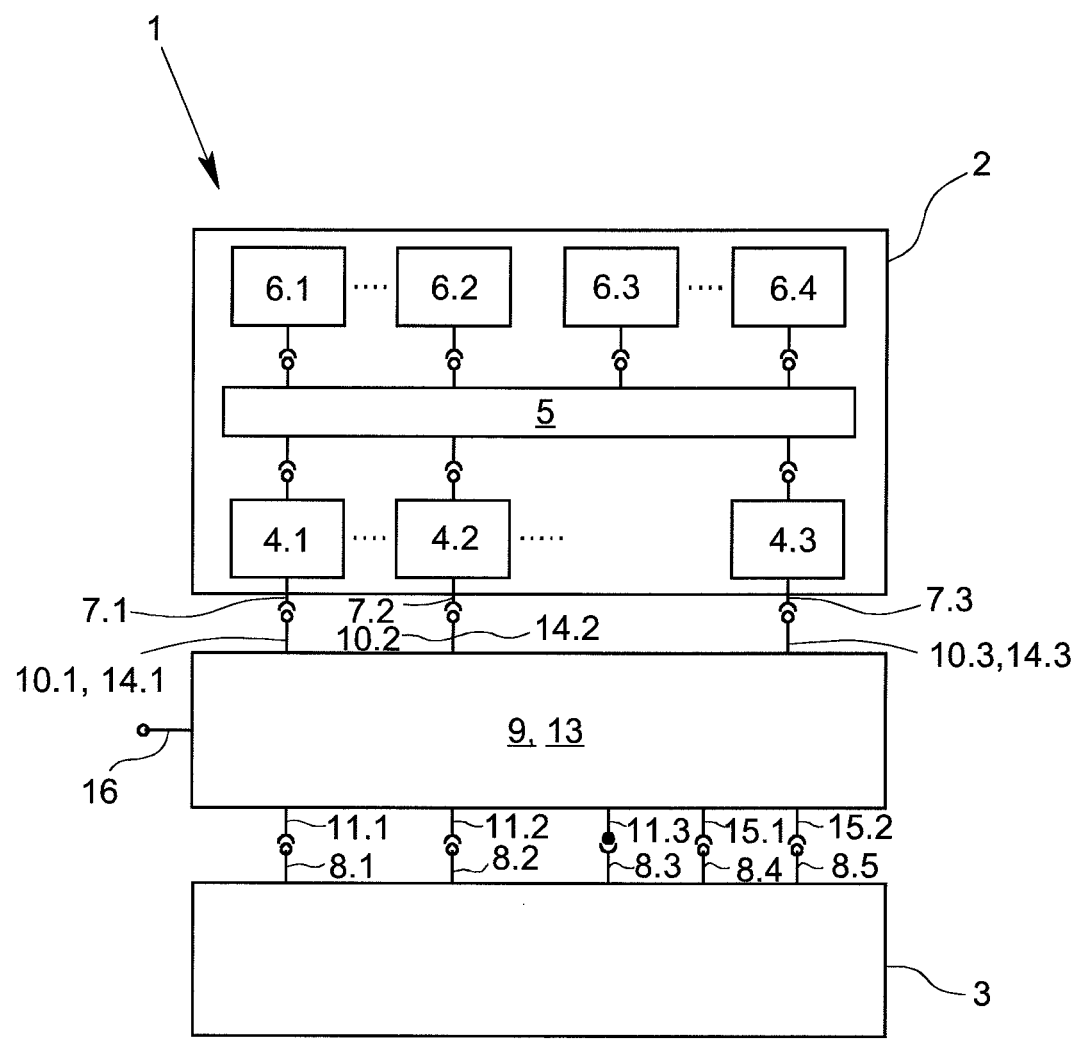
FIG. 6 shows another exemplary embodiment for a test device according to the invention with a combined virtual electronic control unit pin module and a virtual manipulation unit.

Shown in the exemplary embodiment from FIG. 6 is that the virtual electronic control unit pin module 9 and the virtual manipulation unit 13 are implemented in a common component, and the virtual electronic control unit pin and the first interface of the virtual manipulation unit 13 are functionally implemented in the common component. The example makes it clear that the different units of the test device 1 and their interfaces are to be understood as functional, and are not tied to implementation in separate or common software modules.

Figure 7:
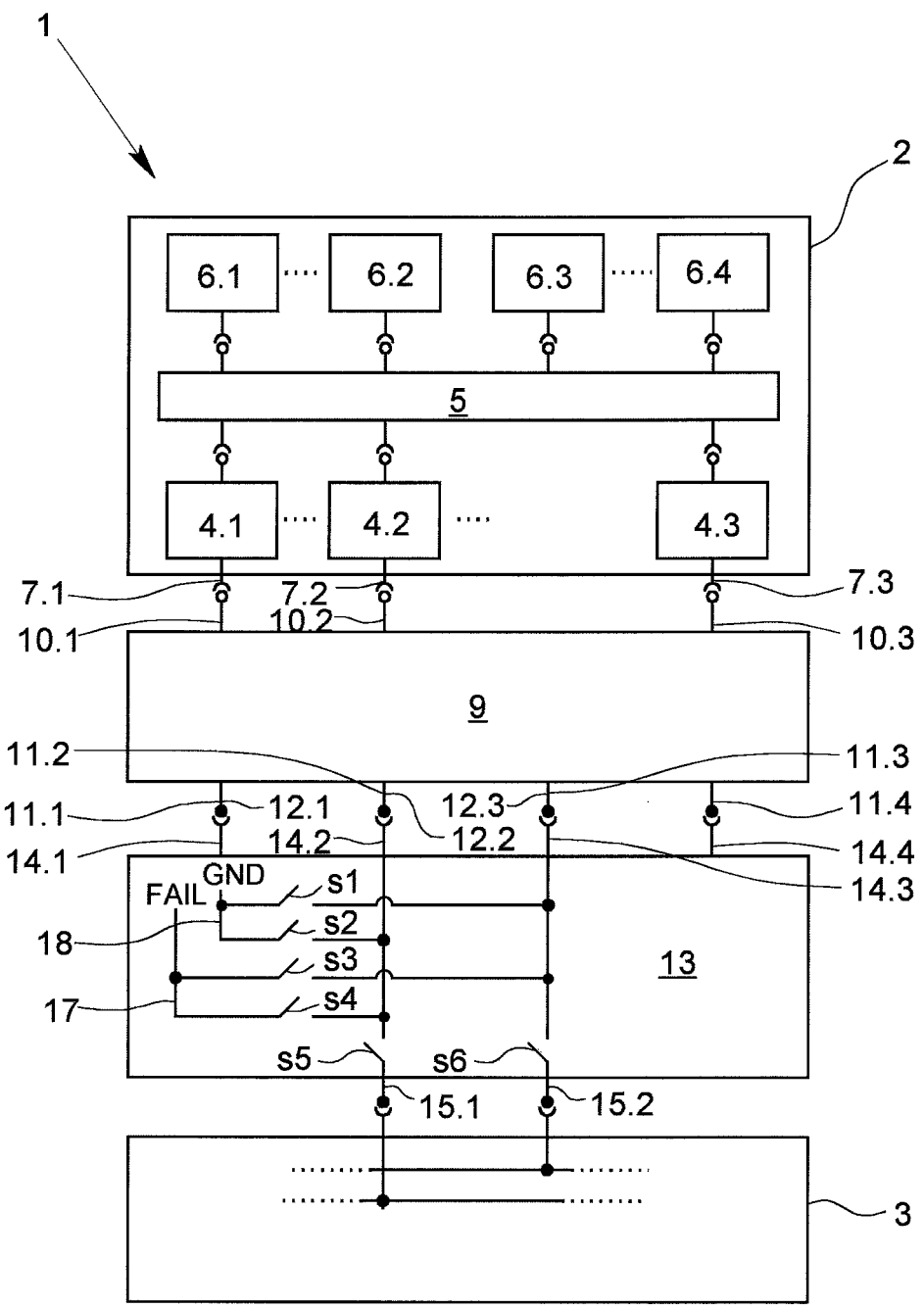
FIG. 7 shows a final exemplary embodiment for a test device according to the invention with an implementation of the virtual manipulation unit shown in detail.

In the case of the test device 1 from FIG. 7, it is noteworthy firstly that all channels of the simulation environment interface 11 of the virtual electronic control unit pin module 9 that are shown are implemented as virtual electronic control unit pins 12, which is to say that all illustrated connections of the virtual electronic control unit pin module 9 in the direction of the simulation environment 3 correspond to a pin of the physical interface of the real control unit to be simulated. This implementation has the advantage that the simulation environment 3 can be used during the entire controller development process, regardless of the closeness of the modeling of the virtual electronic control unit 2 to the hardware, which may vary. The adaptations required because of changes in the modeling of the virtual electronic control unit 2 are to be undertaken on the virtual electronic control unit pin module 9. Even though the virtual electronic control unit pin module 9 must be adapted, this solution is nevertheless advantageous since the simulation environment 3 can continue to be used in every case during the transition from the virtual test to the real test in an HIL simulator, which would not otherwise be possible. In addition to the channels shown, other data channels—not shown here—between the simulation environment 3 and the virtual electronic control unit 2 can be implemented so that the simulation environment 3 can exercise influence on the virtual electronic control unit 2; these data channels and the connections through which these data channels are routed then do not correspond to data channels and connections (pins) of the real control unit. Tasks can be triggered on the virtual electronic control unit 2 from the simulation environment through additional data channels of this type, for example; this depends on the functional scope of the simulation environment 3.

In addition, one possible implementation of a functionality that is used to inject a virtual electrical fault is symbolically represented in the virtual manipulation unit 13 in FIG. 7. The connections 12.2, 12.3 of the virtual electronic control unit pin module 9 are virtual electronic control unit pins 12 of a CAN bus. These connections are symbolically looped through the virtual manipulation unit 13 and are passed on to the simulation environment 3 through the connections 15.1, 15.2 of the second interface of the virtual manipulation unit 13. The simulation environment 3 has the lines of the virtual CAN bus, likewise symbolically. The virtual manipulation unit 13 has virtual electrical fault lines 17, 18, wherein the virtual electrical fault lines 17, 18 can be connected to connections of the first interface 14 and/or to connections of the second interface 15. The connectability is implemented through the switches s1 through s6. The switch network shown in FIG. 7 functionally and clearly depicts the possibility of fault injection in the virtual manipulation unit 13. This functionality is actually implemented in software, so that switches and connection points are represented by variables, wherein the values assigned to these variables result in a corresponding assignment of fault signals to nodes of the network. In the present case, virtual physical quantities, in the present case the electrical potentials GND and FAIL, are applied to the virtual electrical fault lines 17, 18.

In other exemplary embodiments, the virtual physical quantities are electrical currents or electrical resistances. In any case, the idea always has the applied virtual physical quantities that also act as specifications for the attached connections of the first interface 14 and/or for the attached connections of the second interface 15. As already mentioned, these need not only be static virtual physical quantities, but instead can also be time-varying virtual physical quantities.

Advantageously, the virtual electronic control unit pin module 13 is designed such that it generates program code for manipulating the virtual physical control unit signals and/or for ascertaining the virtual physical control unit signals. As a result, the program code does not have to be specified by the user of the test device, but instead a possible functionality for fault simulation can be modeled by, e.g., a graphical editor—for example, in the form of a switch network as shown in FIG. 7—so that the potentially error-prone step of transferring the functionality into program code by the user of the test device is eliminated. Provision is preferably made that at least the program code of the virtual electronic control unit 2, the program code of the simulation environment 3, and the program code generated by the virtual electronic control unit 2 are executed in a common simulation, wherein the simulation is, in particular, a real-time simulation.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A test device for testing at least a portion of a virtual electronic control unit with a simulation environment in a simulator, the test device having the virtual electronic control unit and the simulation environment, wherein the virtual electronic control unit comprises at least one software component with at least one external data interface, wherein the simulation environment comprises at least one data interface for at least indirect data exchange with the virtual electronic control unit, comprising:

a virtual electronic control unit pin module having at least one virtual electronic control unit interface that is connected via the virtual electronic control unit interface to at least the external data interface of the software component of the virtual electronic control unit;

at least one simulation environment interface provided in the virtual electronic control unit pin module that is connected by the simulation environment interface at least indirectly to the data interface of the simulation environment;

at least one virtual electronic control unit pin provided in the virtual electronic control unit pin module that corresponds to a pin of a physical interface of a real control unit to be simulated, wherein a virtual representation of a physical control unit signal is transmitted through the virtual electronic control unit pin, the virtual representation of the physical control unit signal describes, in the form of data, the physical control unit signal at the corresponding pin of the physical interface of the real control unit to be simulated; and a virtual manipulation unit having at least a first interface and a second interface and the virtual manipulation unit is connected at least to the virtual electronic control unit pin of the control unit pin module by the first interface and is connected to the data interface of the simulation environment by the second interface, the virtual manipulation unit adapted to output a manipulated virtual representation of the physical control unit signal through the first interface and/or the second interface.

2. The test device according to claim 1, wherein the virtual manipulation unit independently provides the manipulated virtual representation of the physical control unit signal without information from the simulation environment and transmits the manipulated virtual representation of the physical control unit signal to the virtual electronic control unit pin module through the first interface.

3. The test device according to claim 1, wherein the virtual manipulation unit calculates the manipulated virtual representation of the physical control unit signal based on information from the simulation environment and transmits the manipulated virtual representation of the physical control unit signal to the virtual electronic control unit pin module through the first interface.

4. The test device according to claim 1, wherein the virtual manipulation unit receives the virtual representation of the physical control unit signal from the virtual electronic control unit pin module and calculates the manipulated virtual representation of the physical control unit signal from the received virtual representation of the physical control unit signal and outputs the manipulated virtual representation of the physical control unit signal to the simulation environment through the second interface.

5. The test device according to claim 1, wherein the virtual manipulation unit is interposed between the virtual electronic control unit pin module and the simulation environment so that an indirect connection exists with the external data interface of the software component of the virtual electronic control unit and/or so that a connection is established with parts of the data interface of the simulation environment that correspond to the external data interface of the software component of the virtual electronic control unit.

6. The test device according to claim 5, wherein the virtual manipulation unit calculates a manipulated virtual representation of the physical control unit signal on the basis of information from the external data interface of the software component of the virtual electronic control unit and/or on the basis of information from parts of the data interface of the simulation environment that correspond to the external data interface of the software component of the virtual electronic control unit.

7. The test device according to claim 1, wherein the virtual manipulation unit calculates a manipulated virtual representation of the physical control unit signal to reproduce an electrical fault at a manipulated virtual electronic control unit pin.

8. The test device according to claim 7, wherein the virtual manipulation unit outputs, at a manipulated virtual electronic control unit pin, a voltage value that corresponds to a short circuit to ground to a supply voltage, or to another external electric potential, and/or in order to simulate a short circuit between two virtual electronic control unit pins outputs the same voltage value on both affected virtual electronic control unit pins as the manipulated virtual representation of the physical control unit signal, and/or interchanges values intended for different virtual electronic control unit pins and outputs them as manipulated virtual representations of the physical control unit signals and simulates an open virtual electronic control unit pin by specifying an electrical resistance value at this virtual electronic control unit pin.

9. The test device according to claim 1, wherein the virtual manipulation unit has at least one virtual electrical fault line, and wherein the virtual electrical fault line is connected to connections of the first interface and/or to connections of the second interface.

10. The test device according to claim 9, wherein a virtual representation of a physical quantity is applied to the virtual electrical fault line or an electrical voltage or an electrical current or an electrical resistance, so that the applied virtual representation of the physical quantity also acts as a specification for the attached connections of the first interface and/or for the attached connections of the second interface, and wherein the virtual representation of the physical quantity is a signal behavior over time.

11. The test device according to claim 10, wherein the virtual representation of the physical quantity that is applied to the virtual electrical fault line is externally specified to the virtual manipulation unit and/or is calculated by the virtual manipulation unit.

12. The test device according to claim 1, wherein program code is generated in the virtual electronic control unit pin module for manipulating virtual electronic control unit signals and/or for ascertaining virtual electronic control unit signals.

13. The test device according to claim 1, wherein at least the program code of the virtual electronic control unit, the program code of the simulation environment, and the program code generated by the virtual electronic control unit are executed in a common simulation, and wherein the simulation is a real-time simulation.

* * * * *